(12) United States Patent
Choi et al.

(10) Patent No.: US 8,461,585 B2
(45) Date of Patent: Jun. 11, 2013

(54) DISPLAY SUBSTRATE AND METHOD OF MANUFACTURING THE SAME

(75) Inventors: Young-Joo Choi, Yongin-si (KR); Woo-Geun Lee, Yongin-si (KR); Do-Hyun Kim, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 28 days.

(21) Appl. No.: 13/111,027

(22) Filed: May 19, 2011

(65) Prior Publication Data
US 2012/0037910 A1    Feb. 16, 2012

(30) Foreign Application Priority Data
Aug. 10, 2010    (KR) .................. 10-2010-0076673

(51) Int. Cl.
*H01L 29/10*    (2006.01)
*H01L 29/12*    (2006.01)

(52) U.S. Cl.
USPC ....... 257/43; 257/E27.116; 438/104; 438/149

(58) Field of Classification Search
USPC .......... 257/43, 59, 72, 359, E27.116; 438/30, 438/34, 104, 149; 349/42, 43, 46, 47
See application file for complete search history.

(56) References Cited

U.S. PATENT DOCUMENTS

| | | | |
|---|---|---|---|
| 2005/0122443 A1* | 6/2005 | Kim et al. ........................ | 349/46 |
| 2009/0283769 A1* | 11/2009 | Park et al. ........................ | 257/59 |
| 2009/0321731 A1* | 12/2009 | Jeong et al. ...................... | 257/43 |
| 2010/0044699 A1* | 2/2010 | Chung et al. ..................... | 257/43 |

* cited by examiner

*Primary Examiner* — Fernando L Toledo
*Assistant Examiner* — Aaron Gray
(74) *Attorney, Agent, or Firm* — Cantor Colburn LLP

(57) ABSTRACT

A display substrate includes; a gate pattern including a gate electrode disposed on a substrate, a gate insulation layer disposed on the substrate and the gate pattern, an insulation pattern including; a first thickness part disposed on a first area of the gate insulation layer overlapping the gate electrode and a second thickness part disposed on a second area of the gate insulation layer adjacent to the first area, an oxide semiconductor pattern disposed on the first thickness part of the first area, an etch stopper disposed on the oxide semiconductor pattern, a source pattern including a source electrode and a drain electrode which contact the oxide semiconductor pattern, and a pixel electrode which contacts the drain electrode.

7 Claims, 6 Drawing Sheets

US 8,461,585 B2

DISPLAY SUBSTRATE AND METHOD OF MANUFACTURING THE SAME

This application claims priority to Korean Patent Application No. 2010-76673, filed on Aug. 10, 2010, and all the benefits accruing therefrom under 35 U.S.C. §119, the content of which in its entirety is herein incorporated by reference.

BACKGROUND OF THE INVENTION

1. Field of the Invention

Exemplary embodiments of the present invention relate to a display substrate and a method of manufacturing the display substrate. More particularly, exemplary embodiments of the present invention relate to a display substrate in which a thin-film transistor ("TFT") including an oxide semiconductor is formed and a method of manufacturing the display substrate.

2. Description of the Related Art

Generally, a liquid crystal display ("LCD") panel includes a first substrate on which switching elements for driving each of a plurality of pixels are formed, a second substrate disposed opposite to the first substrate, and a liquid crystal layer interposed between the first and second substrates. When a voltage is applied to the liquid crystal layer, an orientation of liquid crystal molecules of the liquid crystal layer is altered to display an image.

The switching element of the LCD panel includes a gate electrode, a semiconductor pattern isolated from the gate electrode, a source electrode electrically connected to the semiconductor pattern, and a drain electrode spaced apart from the source electrode. The switching elements may be, for example, amorphous-silicon (a-Si) thin-film transistors ("TFTs"), poly-silicon (poly-Si) TFTs, oxide semiconductor TFTs, etc.

The a-Si TFT has a benefit of being readily formed in a uniform manner on large size substrates at a relatively low cost. However, the a-Si TFT undesirably has a relatively low charge mobility which may lead to threshold voltage degradation. In contrast, poly-Si TFTs have a benefit of a high charge mobility, so that deterioration of the switching element's characteristics is small in comparison with the a-Si TFT. However, a poly-Si TFT LCD device has a more complex manufacturing process than an a-Si TFT LCD, so that its manufacturing cost is undesirably higher than that of the a-Si TFT LCD.

The oxide semiconductor TFT may be manufactured in a low temperature process, and may be utilized in large size display panels. In addition, the oxide semiconductor TFT may have a high charge mobility. However, when a structure of the oxide semiconductor TFT is applied to the LCD panel in a manner similar to that in which the a-Si TFT or p-Si TFT are applied to the LCD panel, a semiconductor pattern of the oxide semiconductor TFT directly contacts with a gate insulation layer including a silicon nitride (SiNx) material disposed below the semiconductor pattern and a passivation layer disposed above the semiconductor pattern. Thus, the semiconductor pattern of the oxide semiconductor TFT is deteriorated due to the contact with the other materials, so that electrical characteristics of the oxide semiconductor TFT may be deteriorated.

BRIEF SUMMARY OF THE INVENTION

Exemplary embodiments of the present invention provide a display substrate capable of enhancing electrical characteristics of a switching element including an oxide semiconductor.

Exemplary embodiments of the present invention provide a method of manufacturing the above-mentioned display substrate capable of enhancing a manufacture reliability.

According to one exemplary embodiment of the present invention, a display substrate includes; a gate pattern, a gate insulation layer, an insulation pattern, an oxide semiconductor pattern, an etch stopper, a source pattern and a pixel electrode. The gate pattern includes a gate electrode disposed on a substrate. The gate insulation layer is disposed on the substrate on which the gate pattern is formed. The insulation pattern includes a first thickness part disposed on the gate insulation layer of a first area overlapping the gate electrode, and a second thickness part disposed on the gate insulation layer of a second area adjacent to the first area to have a thinner thickness than the first thickness part. The oxide semiconductor pattern is disposed on the first thickness part of the first area. The etch stopper is disposed on the oxide semiconductor pattern. The source pattern includes a source electrode and a drain electrode making contact with the oxide semiconductor pattern. The pixel electrode makes contact with the drain electrode.

In an exemplary embodiment, first and second end portions of the etch stopper disposed opposite to each other may be disposed on the oxide semiconductor pattern so that two end portions of the oxide semiconductor pattern respectively adjacent to the first and second end portions are exposed by the etch stopper. Each of the source electrode and drain electrode may be partially overlapped with the first and second end portions and may directly contact with the two end portions of the exposed oxide semiconductor pattern.

In an exemplary embodiment, first and second end portions of the etch stopper may be disposed on the oxide semiconductor pattern, and third and fourth end portions of the etch stopper disposed substantially perpendicular to the first and second end portions may be extended from the first area to the second area to be disposed on the second thickness part of the insulation pattern. For one example, the etch stopper may cover side walls of the oxide semiconductor pattern at a boundary between the first area and the second area. For another exemplary embodiment, each etch surfaces of the third and fourth end portions may be disposed such that a shape of the third and fourth end portions and an etch surface of the insulation pattern disposed at a boundary between the third area and the second area are substantially identical and aligned with one another from a top plan view perspective.

In an exemplary embodiment, the insulation pattern and the etch stopper may be formed from a same material layer, and the gate insulation layer may be formed from a material different from the insulation pattern.

According to another exemplary of the present invention, there is provided a method of manufacturing a display substrate. In the method, a gate pattern including a gate electrode is disposed on a substrate. A gate insulation layer, a first protection layer having a first thickness and an oxide semiconductor layer are sequentially disposed on the substrate on which the gate pattern is disposed. The oxide semiconductor layer and the first protection layer are etched to form an oxide semiconductor pattern on an area which overlaps with the gate electrode and to form the first protection layer adjacent to the oxide semiconductor pattern to have a second thickness thinner than the first thickness. A second protection layer is disposed on the substrate on which the oxide semiconductor pattern is formed. The first protection layer, which is partially etched, and the second protection layer are etched to form an etch stopper on an insulation pattern and the oxide semiconductor pattern at an overlapped area. A source pattern including a source electrode and a drain electrode are formed. The source electrode and the drain electrode make contact with the oxide semiconductor pattern. A pixel electrode is formed in contact with the drain electrode.

In an exemplary embodiment, the first protection layer may be wet-etched by an etching solution substantially identical to an etching solution which etches the oxide semiconductor layer, and the first protection layer corresponding to an area adjacent to the oxide semiconductor pattern may be partially etched to have a second thickness thinner than the first thickness. In such an exemplary embodiment, the etching solution may include fluorine (F).

In an exemplary embodiment, a photoresist pattern may be disposed on the oxide semiconductor layer, the oxide semiconductor layer may be etched using the photoresist pattern as an etching stop layer to form the oxide semiconductor pattern, and the first protection layer may be partially removed using the photoresist pattern and the oxide semiconductor pattern as an etching stop layer, so that the partially removed first protection layer may be formed.

In an exemplary embodiment, a photoresist pattern may be disposed on the second protection layer, the second protection layer may be etched using the photoresist pattern as an etching stop layer to form the etch stopper, and the first protection layer partially etched using the photoresist pattern and the oxide semiconductor pattern as an etching stop layer may be patterned to form the insulation pattern.

In an exemplary embodiment, the first protection layer and the second protection layer may include a same material, and the gate insulation layer may include a different material from the first and second protection layers.

In an exemplary embodiment, the first thickness may be about 500 Å, the second thickness may be about 300 Å to about 450 Å, and a thickness of the second protection layer may be about 500 Å.

According to an exemplary embodiment of a display substrate and a method of manufacturing the display substrate, in order to prevent a directly contact between a semiconductor pattern including an oxide semiconductor and a gate insulation layer, a protection layer interposed between the semiconductor pattern and the gate insulation layer is partially removed to have a predetermined thickness in a process for forming the semiconductor pattern. Thus, the protection layer having a second thickness thinner than a first thickness of an initial state may be patterned together, e.g., simultaneously, with the etch stopper in a process for forming an etch stopper on the semiconductor pattern. The protection layer may be maintained between the semiconductor pattern and the gate insulation layer to have a first thickness, and an unnecessary portion of the protection layer having the second thickness may be removed in a process for forming the etch stopper. Thus, an insulation pattern is formed, so that a direct contact between the semiconductor pattern and a gate insulation layer may be prevented. Therefore, a patterning time of the protection layer may be decreased, and degradation of electrical characteristics of a switching element may be prevented. In addition, a reliability of the patterning process of the etch stopper and the protection layer may be enhanced.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

Figure 1:
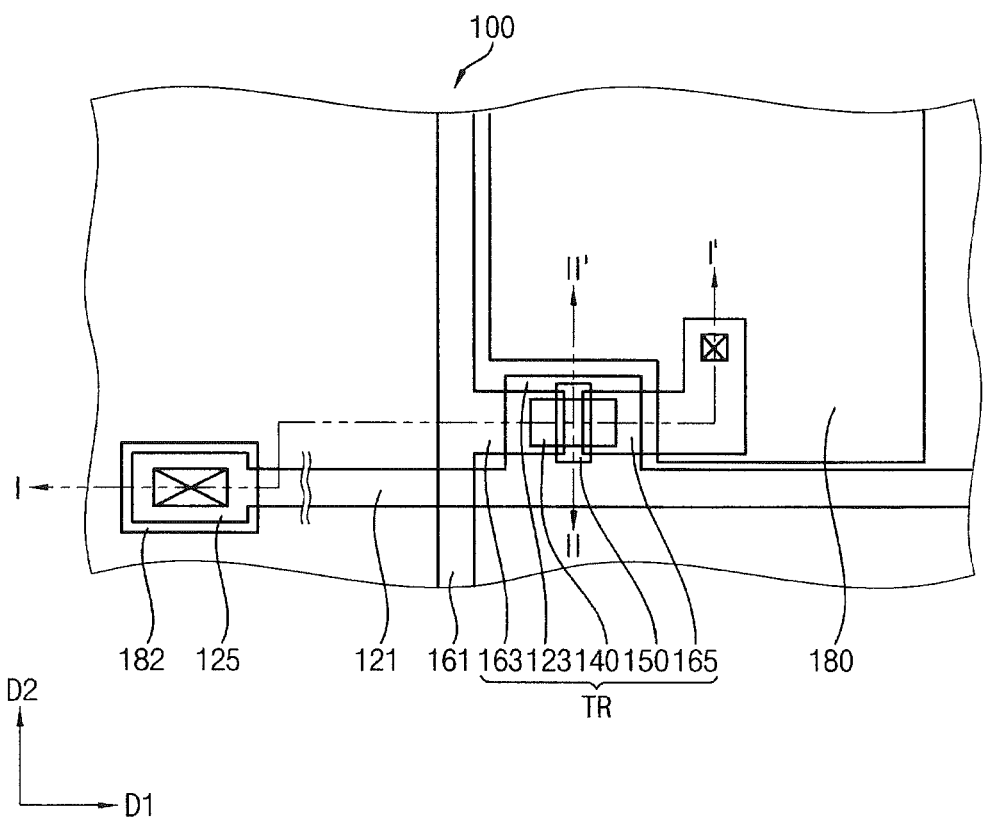
FIG. 1 is a top plan view illustrating an exemplary embodiment of a display substrate according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 2:
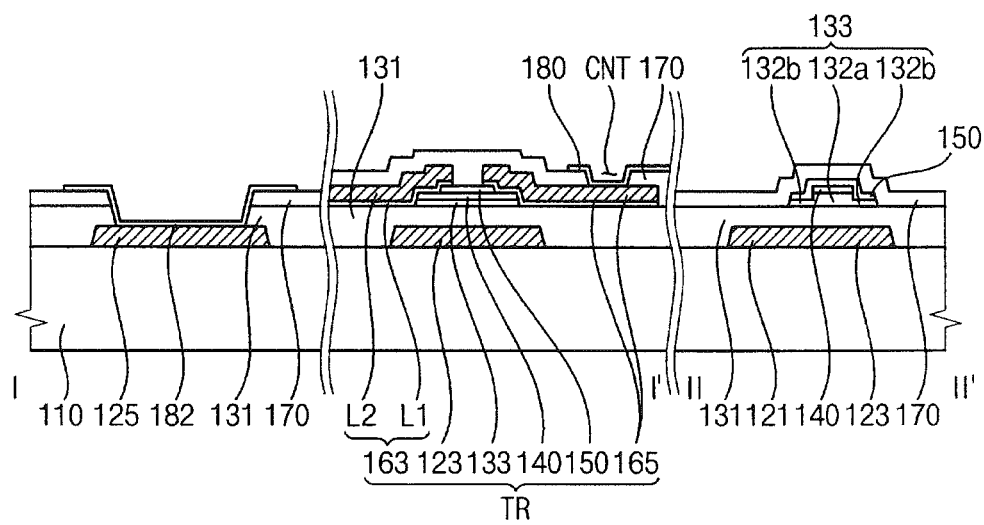
FIG. 2 is a cross-sectional view taken along line I-I' and line II-II' of FIG. 1.

FIG. 1 is a top plan view illustrating an exemplary embodiment of a display substrate according to the present invention. FIG. 2 is a cross-sectional view taken along line I-I' and line II-II' of FIG. 1.

Referring to FIGS. 1 and 2, the present exemplary embodiment of a display substrate 100 includes a gate line 121, a data line 161, a switching element TR and a pixel electrode 180 that are formed on a substrate 110.

The gate line 121 is extended along a first direction D1 of the substrate 110, and the data line 161 is extended along a second direction D2 which is different from the first direction D1. For example, in the present exemplary embodiment the second direction D2 may perpendicular with the first direction D1. A first end portion of the gate line 121 is connected to a gate end portion electrode 125. In the present exemplary embodiment, the gate end portion electrode 125 is electrically connected to a gate pad electrode 182, although alternative exemplary embodiments include alternative configurations, such as a direct connection to a gate driving circuit, etc.

The switching element TR is electrically connected to the gate line 121, the data line 161 and the pixel electrode 180. The switching element TR includes a gate electrode 123 connected to the gate line 121, a source electrode 163 connected to the data line 161, an oxide semiconductor pattern 140, an etch stopper 150 and a drain electrode 165 spaced apart from the source electrode 163 with respect to the etch stopper 150.

An insulation pattern 133 (refer to FIG. 2) is formed below the oxide semiconductor pattern 140 and the etch stopper 150 as seen from a cross-sectional perspective, e.g., the insulation pattern 133 is disposed a closer distance to the underlying substrate 110 than the semiconductor pattern 140 and the etch stopper 150. The oxide semiconductor pattern 140 is formed on an area overlapping the gate electrode 123. In one exemplary embodiment, the oxide semiconductor pattern 140 may have a rectangular shape as seen from a top plan view. The etch stopper 150 is formed in the first direction D1 to have a shorter length than the oxide semiconductor pattern 140 in the first direction D1, so that the etch stopper 150 may expose two opposing end portions of the oxide semiconductor pattern 140 in the first direction D1. In one exemplary embodiment, the source electrode 163 and the drain electrode 165 may overlap with two end portions of the etch stopper 150 along the first direction D1. The etch stopper 150 is formed along the second direction D2 to have a longer length than the oxide semiconductor pattern 140 along the second direction D2, so that the etch stopper 150 may cover two end portions of the oxide semiconductor pattern 140 disposed to be opposite to each other along the second direction D2.

The pixel electrode 180 contacts a first end portion of the drain electrode 165, e.g., via a through hole. Thus, the pixel electrode 180 may be electrically connected to the switching element TR.

Referring to FIGS. 1 and 2, in the present exemplary embodiment the gate line 121 and the gate electrode 123 are directly formed on the substrate 110. In the present exemplary embodiment, the gate line 121 and the gate electrode 123 are formed from a same metal layer and may be referred to as a gate pattern. The gate pattern may further include the gate end portion electrode 125.

The display substrate 100 includes a gate insulation layer 131. The gate insulation layer 131 is formed on the substrate 110 including the gate pattern to cover the gate line 121 and the gate electrode 123 and to expose a portion of the gate end portion electrode 125. In the present exemplary embodiment, the gate insulation layer 131 may include a silicon nitride, although alternative exemplary embodiments include alternative materials for the gate insulation layer 131. In one such alternative exemplary embodiment, the gate insulation layer 131 may include a silicon oxide. In one exemplary embodiment, the gate insulation layer 131 may be formed on substantially an entire surface of the substrate 110. In one exemplary embodiment, a thickness of the gate insulation layer 131 may be about 500 Å. In the exemplary embodiment wherein the gate insulation layer 131 is a silicon nitride layer, the gate insulation layer 131 may be formed to have a substantially uniform thickness and at a relatively higher formation speed than in the exemplary embodiment wherein the gate insulation layer 131 is a silicon oxide layer.

The insulation pattern 133 is formed on the gate insulation layer 131. For example, the insulation pattern 133 is formed on the gate insulation layer 131 at an area overlapping the gate electrode 123 and the gate line 121. In the present exemplary embodiment, the insulation pattern 133 may include oxide silicon. In the region overlapping the gate electrode 123, the insulation pattern 133 includes a first thickness part 132a and a second thickness part 132b having a thickness different from a thickness of the first thickness part 132a. A detailed explanation of the insulation pattern 133 will be explained with reference to FIGS. 3A and 3B below.

The oxide semiconductor pattern 140 is formed on the first thickness part 132a of the insulation pattern 133 overlapping the gate electrode 123. The oxide semiconductor pattern 140 includes a metal oxide material. For example, the metal oxide material may include at least one of gallium (Ga) oxide, indium (In) oxide, tin (Sn) oxide, zinc (Zn) oxide and other materials with similar characteristics. Moreover, the metal oxide material may further include at least one of lithium (Li), beryllium (Be), sodium (Na), magnesium (Mg), calcium (Ca), scandium (Sc), titanium (Ti), vanadium (V), manganese (Mn), iron (Fe), nickel (Ni), copper (Cu), yttrium (Y), zirconium (Zr), niobium (Nb), ruthenium (Ru), palladium (Pd), cadmium (Cd), tantalum (Ta), tungsten (W), boron (B), carbon (C), nitrogen (N), fluorine (F), aluminum (Al), silicon (Si), phosphorus (P), germanium (Ge), and other materials with similar characteristics. For example, the oxide semiconductor pattern 140 may include a single metal oxide material such as gallium oxide, indium oxide, tin oxide, zinc oxide, etc., or a multiple metal oxide material such as gallium indium zinc oxide ($Ga_2O_3$—$In_2O_3$—$ZnO$, GIZO), indium gallium tin oxide ($In_2O_3$—$Ga_2O_3$—$SnO$), indium zinc oxide ($In_2O_3$—$Zn_2O_3$), zinc aluminum oxide ($Zn_2O_3$—$Al_2O_3$), and other materials with similar characteristics.

The etch stopper 150 is formed on the substrate 110 including the oxide semiconductor pattern 140. In the present exemplary embodiment, the etch stopper 150 may include an oxide silicon. In one exemplary embodiment, a thickness of the etch stopper 150 may be about 500 Å. The etch stopper 150 may prevent the oxide semiconductor pattern 140 from being damaged during a process for forming the source electrode 163 and the drain electrode 165.

The source electrode 163 and the drain electrode 165 are formed on the substrate 110 on which the etch stopper 150 is formed, so that the source electrode and the drain electrode 165 may directly contact the etch stopper 150, the oxide semiconductor pattern 140 and the gate insulation layer 131. The source electrode 163 and the drain electrode 165 are formed from a same metal layer and may be referred to as a source pattern. The source pattern may further include the data line 161. Exemplary embodiments include configurations wherein the source pattern may include a first metal layer L1 and a second metal layer L2 that are sequentially formed one on top of the other. In one exemplary embodiment of such a dual metal layer configuration, the first metal layer L1 includes titanium (Ti), and the second metal layer L2 may include copper (Cu). In the source pattern, a layer delivering a signal is the second metal layer L2, and the first metal layer L1 may enhance an adhesive force between the first metal layer L1 and a layer below the first metal layer L1.

The display substrate 100 may further include a passivation layer 170. The passivation layer 170 covers the switching element TR and includes a contact hole CNT exposing a first end portion of the drain electrode 165. The passivation layer 170 may further include a hole formed through an area corresponding to a hole of the gate insulation layer 131 which exposes the gate end portion electrode 125. As described above, a portion of the gate end portion electrode 125 may be exposed through holes formed through the gate insulation layer 131 and the passivation layer 170. Although the passivation layer 170 is illustrated as being relatively thin in FIG. 2, alternative exemplary embodiments include configurations wherein the passivation layer 170 planarizes the display substrate 100.

A pixel electrode 180 and the gate pad electrode 182 may be formed on the substrate 110 including the passivation layer 170. The pixel electrode 180 is electrically connected to the switching element TR through the contact hole CNT. The gate pad electrode 182 is electrically connected to the gate end portion electrode 125 through holes formed through the gate insulation layer 131 and the passivation layer 170.

Hereinafter, a structure of the switching element TR will be explained in detail with reference to FIGS. 3A and 3B.

Figure 3A:
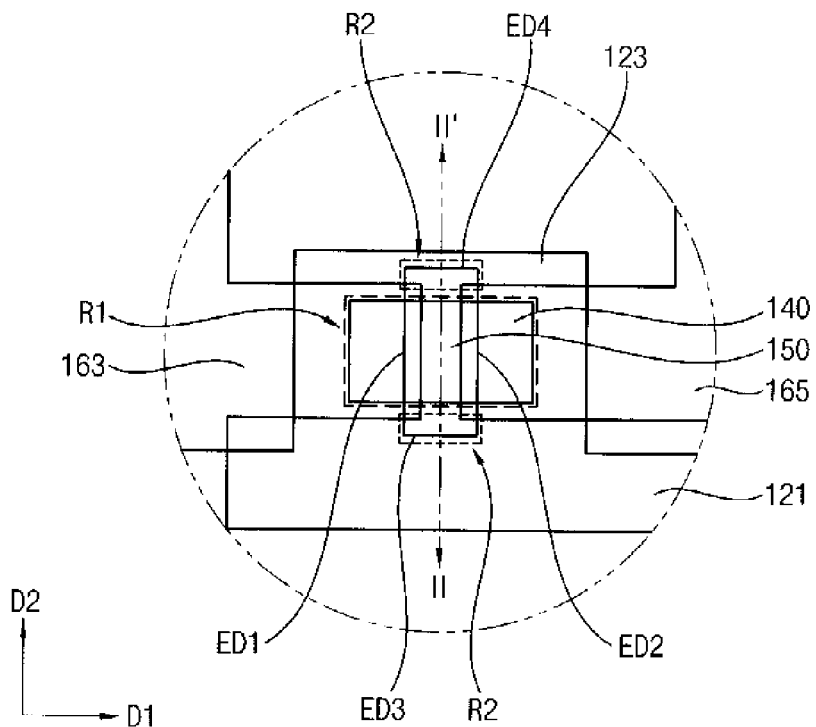
FIG. 3A is an enlarged top plan view illustrating an exemplary embodiment of a switching element of FIG. 1.

FIG. 3A is an enlarged top plan view illustrating an exemplary embodiment of a switching element of FIG. 1.

Figure 3B:
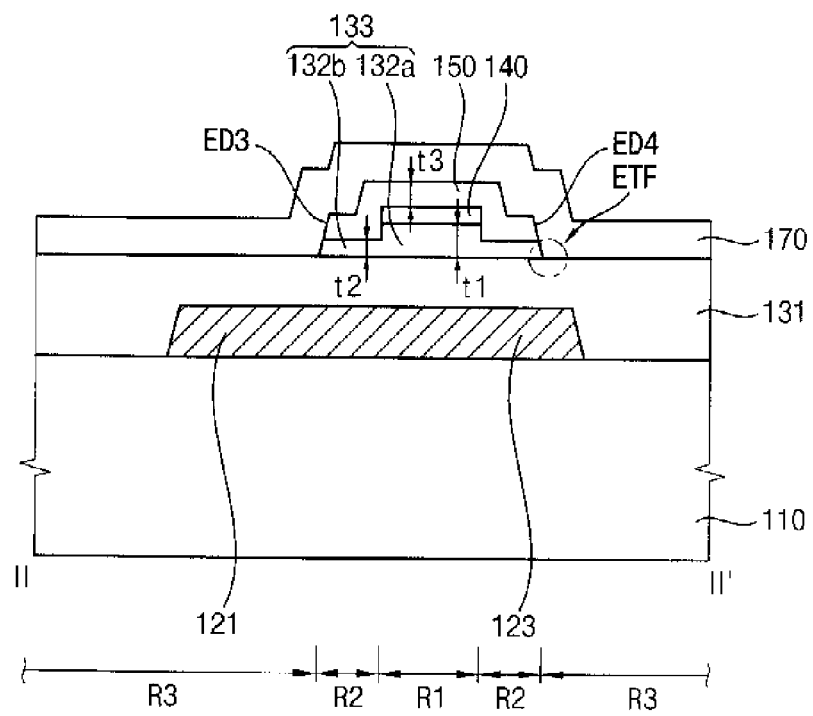
FIG. 3B is a cross-sectional view taken along line II-II' of FIG. 3A.

FIG. 3B is a cross-sectional view taken along line II-II' of FIG. 3A.

Referring to FIGS. 3A and 3B, the first thickness part 132a of the insulation pattern 133 is formed on the gate insulation layer 131 which corresponds to a first region R1 of an area overlapped with the gate electrode 123. In such an exemplary embodiment, the first thickness part 132a may have a first thickness 't1'. The first region R1 is an area substantially identical to an area where the oxide semiconductor pattern 140 is formed. The gate insulation layer 131, the first thickness part 132a, the oxide semiconductor pattern 140, the etch stopper 150 and the passivation layer 170 are sequentially formed on the first region R1 as seen from a cross-sectional view.

The second thickness part 132b is formed on the gate insulation layer 131 of a second region R2 adjacent to the first region R1. For example, the second region R2 is a region disposed along the second direction D2 with respect to the first region R1. The gate insulation layer 131, the second thickness part 132b, the etch stopper 150 and the passivation layer 170 are sequentially formed on the second region R2 as seen from a cross-sectional view. The second thickness part 132b may have a second thickness 't2' thinner than a first thickness 't1' of the first thickness part 132a. In the present exemplary embodiment, the first thickness 't1' may be about 500 Å, and the second thickness 't2' may be about 300 Å to about 450 Å.

A first end portion ED1 of the etch stopper 150, e.g., an edge of the etch stopper 150 in the first direction D1, is disposed on the first region R1, and a second end portion ED2 of the etch stopper 150, e.g., an opposing edge of the etch stopper 150 in the first direction D1, opposite to the first end portion ED1 along the first direction D1 of the first end portion ED1 is also disposed on the first region R1. Thus, the first and second end portions ED1 and ED2 are disposed on the oxide semiconductor pattern 140, and the oxide semiconductor pattern 140 is exposed by the etch stopper 150.

A third end portion ED3 of the etch stopper 150, e.g., an edge of the etch stopper 150 in the second direction, disposed along the second direction D2, substantially perpendicular to the first and second end portions ED1 and ED2, is extended from the first area R1 to the second area R2. A fourth end portion ED4 of the etch stopper 150, e.g., an edge of the etch stopper 150 in the second direction substantially opposite to the third end portion ED3, which is disposed along the second direction D2 opposite to the third end portion ED3, is extended from the first area R1 to the second area R2. Thus, the third and fourth end portions ED3 and ED4 are disposed on the second thickness part 132b. The etch stopper 150 may cover side walls of the oxide semiconductor pattern 140 at a boundary between the first area R1 and the second area R2. An etch surface of the third end portion ED3 may be disposed on the same line identical to an etch surface ETF of the insulation pattern 133 disposed at a boundary between the third area R3 and the second area R2, that is, the third end portion ED3 and the underlying insulation pattern 133 may have sidewalls which together define a single plane. The etch surface ETF of the insulation pattern 133 may be substantially the same as an etch surface of the second thickness part 132b, that is, on the etch surface ETF, only the second thickness part 132b may be etched. The etch stopper 150 is formed to be deposited with a uniformly formed thickness, that is, a third thickness 't3' along planar portions thereof. The third thickness 't3' may be about 500 Å. Stepped areas of the etch stopper 150 may have a greater thickness due to a nature of the formation process.

Two end portions of the oxide semiconductor pattern 140 respectively adjacent to the first and second end portions ED1 and ED2 are exposed by the etch stopper 150, that is, the etch stopper 150 does not cover the oxide semiconductor pattern 140 beyond the first and second end portions ED1 and ED2. Each of the two end portions of the exposed oxide semiconductor pattern 140 may directly contact the source electrode 163 and the drain electrode 165, respectively.

Hereinafter, an exemplary embodiment of a method of manufacturing the exemplary embodiment of a display substrate of FIG. 2 will be explained with reference to FIGS. 4A to 7A and FIGS. 4B to 7B.

Figure 4A:
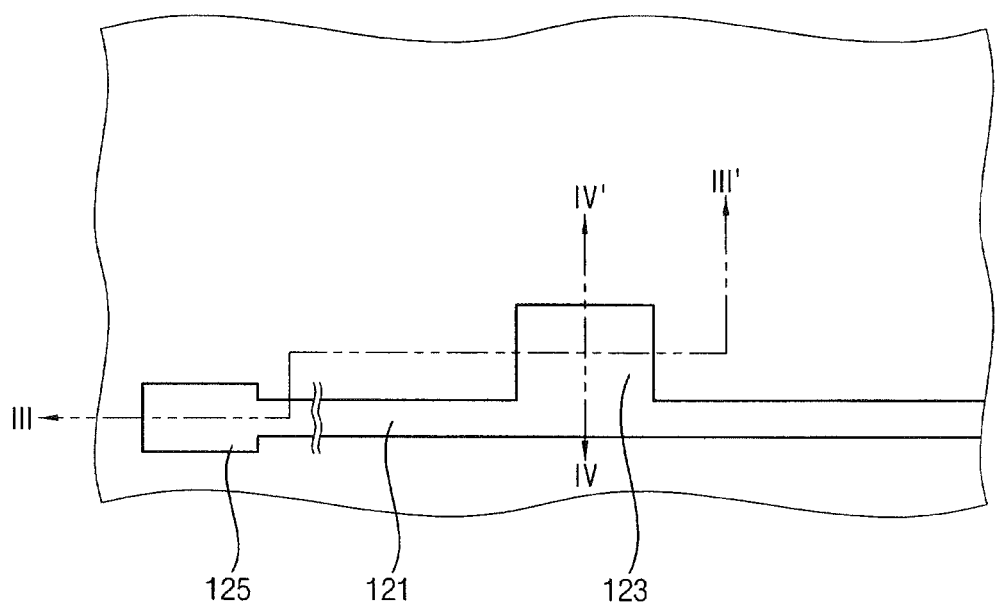
FIGS. 4A and 4B are a top plan view and a cross-sectional view, respectively, illustrating a step for forming an exemplary embodiment of a gate pattern of the exemplary embodiment of a display substrate of FIG. 2.
Figure 4B:
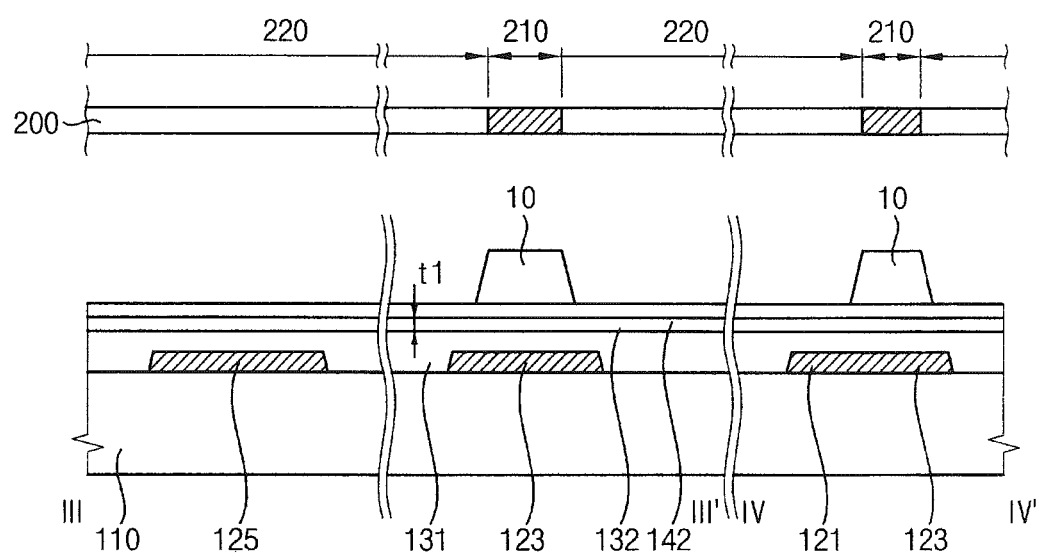

FIGS. 4A and 4B are a top plan view and a cross-sectional view, respectively, illustrating a step for forming an exemplary embodiment of a gate pattern of an exemplary embodiment of a display substrate of FIG. 2.

For example, FIG. 4A is a top plan view illustrating a step for forming exemplary embodiments of a gate pattern, a gate insulation layer, a first protection layer and a semiconductor layer, and FIG. 4B is a cross-sectional view taken along line III-III' and line IV-IV' of FIG. 4A.

Referring to FIGS. 4A and 4B, the gate pattern is formed on the substrate 110.

A gate metal layer is formed on the substrate 110, and then the gate metal layer is patterned using a first mask (not shown) to form the gate pattern. In one exemplary embodiment, the gate metal layer may include a copper layer. Alternative exemplary embodiments include configurations wherein the gate metal layer may have a double layer structure on which a titanium layer and a copper layer are sequentially formed.

The gate insulation layer 131 is formed on the substrate 110 including the gate pattern. Then, a first protection layer 132 is formed on the substrate 110 including the gate insulation layer 131. In one exemplary embodiment, the first protection layer 132 may include oxide silicon. The first protection layer 132 may be formed on substantially an entire surface of the substrate 110 including the gate insulation layer 131 to have the first thickness 't1'. A semiconductor layer 142 is formed on the first protection layer 132. In the present exemplary embodiment, the semiconductor layer 142 may include a metal oxide material.

Then, a first photo pattern 10 is formed on the substrate on which the gate insulation layer 131, the first protection layer 132 and the semiconductor layer 142 are sequentially formed. In one exemplary embodiment, a photoresist layer is formed on the semiconductor layer 142, and then the photoresist layer is patterned using a second mask 200 to form the first photo pattern 10. In one exemplary embodiment, the second mask 200 includes a first light-blocking portion 210 and a first opening portion 220. In an exemplary embodiment wherein the photoresist layer is a positive type, a photoresist layer corresponding to the first light-blocking portion 210 remains due to a developing solution that is used for forming the first photo pattern 10. In an exemplary embodiment wherein the photoresist layer is a negative type, the first light-blocking portion 210 and the first opening portion 220 of the second mask 200 may be the reverse of the above described configuration. The first photo pattern 10 may be formed on the first area R1 (refer to FIGS. 3A and 3B) of an overlapped area of the gate electrode 123.

Figure 5A:
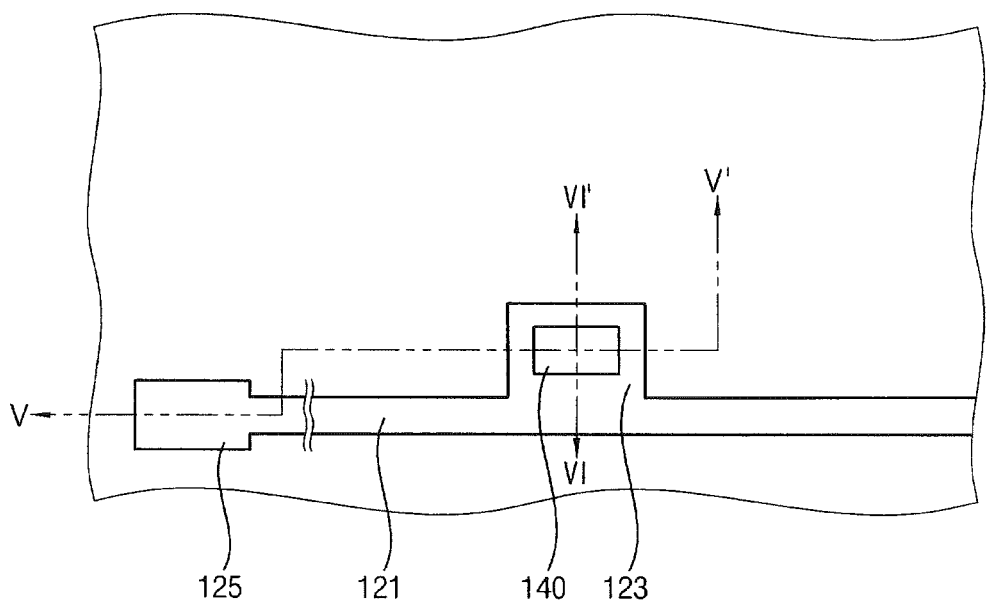
FIGS. 5A and 5B are a top plan view and a cross-sectional view, respectively, illustrating a step for forming an exemplary embodiment of an oxide semiconductor pattern of the exemplary embodiment of a display substrate of FIG. 2.
Figure 5B:
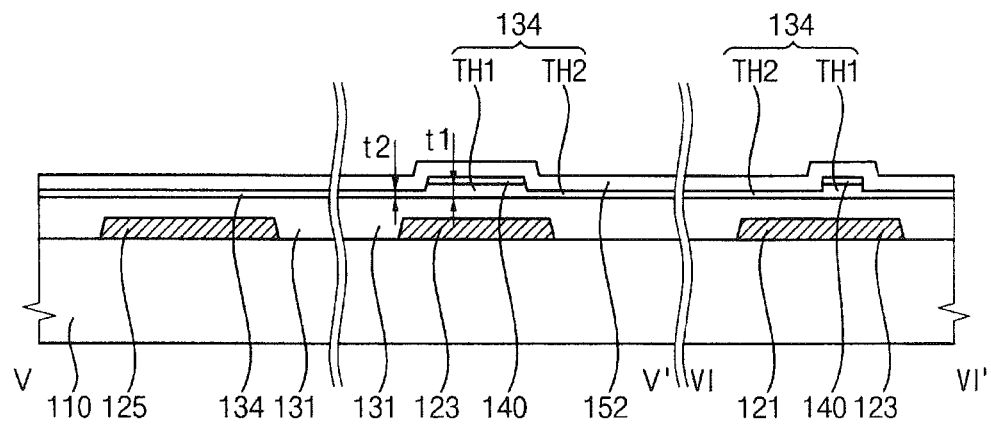

FIGS. 5A and 5B are a top plan view and a cross-sectional view, respectively, illustrating a step for forming an oxide semiconductor pattern of the exemplary embodiment of a display substrate of FIG. 2.

For example, FIG. 5A is a top plan view illustrating a step for forming an oxide semiconductor pattern and a partial etching layer, and FIG. 5B is a cross-sectional view taken along line V-V' and line VI-VI' of FIG. 5A.

Referring to FIGS. 5A and 5B, the semiconductor layer 142 is patterned using the first photo pattern 10 as an etch stop layer.

The semiconductor layer 142 is patterned through a wet etch process using an etching solution. In one exemplary embodiment, the etching solution may include fluorine (F). An exemplary embodiment of a compound of the etching solution including fluorine (F) may be sodium fluoride (NaF), sodium hydrogen fluoride (NaHF$_2$), ammonium fluoride (NH$_4$F), ammonium hydrogen fluoride (NH$_4$HF$_2$), ammonium tetrafluoroborate (NH$_4$BF$_4$), potassium fluoride potassium fluoride (KF), potassium bifluoride (KHF$_2$), aluminum fluoride (AlF$_3$), fluoroboric acid (HBF$_4$), lithium fluoride (LiF), potassium tetrafluoroborate (KBF$_4$), calcium fluoride (CaF$_2$), and other materials having similar characteristics. The etching solution may include at least one of the above compounds. The semiconductor layer 142 is patterned, so that the oxide semiconductor pattern 140 is formed only on the first area R1, e.g., only on the first area R1 in each of several pixels.

When the oxide semiconductor pattern 140 is over-etched by the etching solution, the first protection layer 132 may be removed by a predetermined thickness after the oxide semiconductor pattern 140 is formed, that is, after the other portions of the semiconductor layer outside of the semiconductor pattern 140 are removed, the etching process may continue to remove a portion of the first protection layer 132. The first protection layer 132 formed from a different material to the oxide semiconductor pattern 140 may be removed by a fluoride ion (F$^-$) included in the etching solution.

Thus, the first protection layer 132 below the oxide semiconductor pattern 140 becomes a first thickness pattern TH1 having the first thickness 't1' that is an initial thickness, and the first protection layer 132 on an area excluding an area where the oxide semiconductor pattern 140 is formed becomes a second thickness pattern TH2 having the second thickness 't2' thinner than the first thickness 't1'. Hereinafter, a layer including a portion where the first protection layer 132 is partially etched to have the first thickness 't1' and a portion having the second thickness 't2' may be referred to as a "partial etching layer" 134. The partial etching layer 134 may have the first thickness pattern TH1 and the second thickness pattern TH2. For example, the first thickness pattern TH1 is formed on the first area R1, and the second thickness pattern TH2 may be formed on the second area R2 (refer to FIGS. 3A and 3B) and the third area R3 (refer to FIGS. 3A and 3B).

Then, a second protection layer 152 is formed on the substrate 110 on which the partial etching layer 134 is formed as discussed in more detail below. In one exemplary embodiment, the second protection layer 152 may include oxide silicon.

Figure 6A:
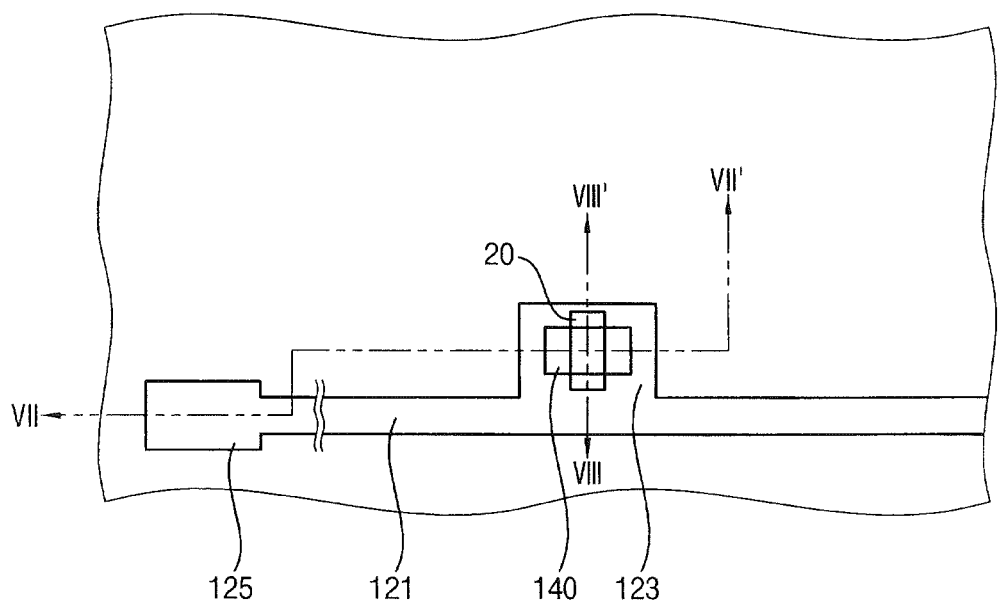
FIGS. 6A and 6B are a top plan view and a cross-sectional view, respectively, illustrating a step for forming an exemplary embodiment of an insulation pattern and an etch stopper of the exemplary embodiment of a display substrate of FIG. 2.
Figure 6B:
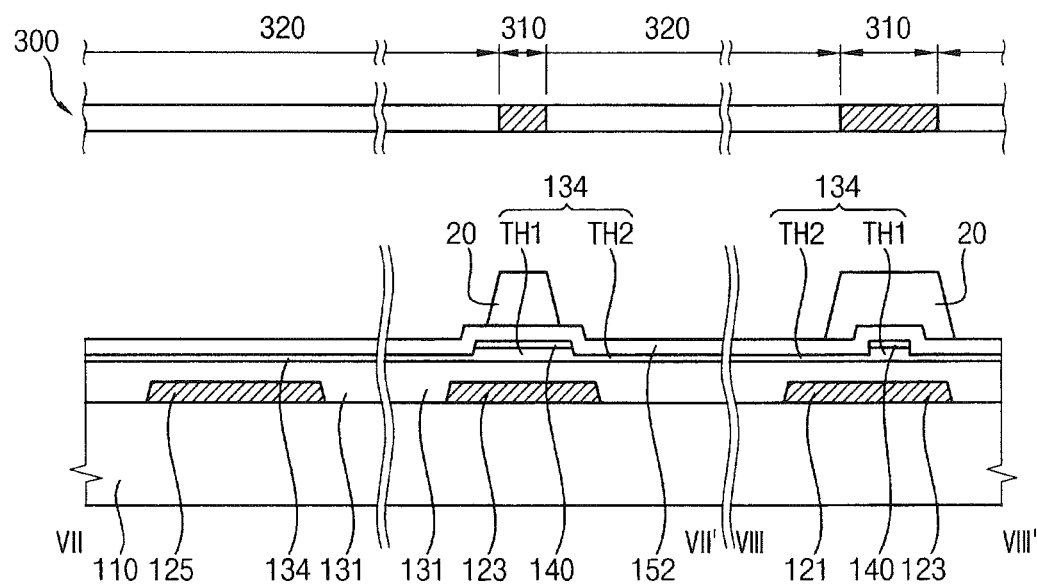

FIGS. 6A and 6B are a top plan view and a cross-sectional view, respectively, illustrating a step for forming an insulation pattern and an etch stopper 150 of a display substrate of FIG. 2.

For example, FIG. 6A is a top plan view illustrating a step for forming an exemplary embodiment of an etch stopper, and FIG. 6B is a cross-sectional view taken along line VII-VII' and line VIII-VIII' of FIG. 6A.

Referring to FIGS. 6A and 6B, a photoresist layer is formed on the substrate 110 on which the second protection layer 152 is formed, and then the photoresist layer is patterned to form a second photo pattern 20.

The second photo pattern 20 may be formed using a third mask 300 on which a second light-blocking portion 310 and a second opening portion 320 are formed, similar to the formation of the first photo pattern 10. The second photo pattern 20 exposes two end portions of the oxide semiconductor pattern 140 along the first direction D1. The two end portions of the second photo pattern 20 are formed on a portion of the first region R1 and the second region R2 to cover two end portions of the oxide semiconductor pattern 140 along the second direction D2.

The second protection layer 152 is etched using the second photo pattern 20 as an etch stop layer to form the etch stopper 150. An exemplary embodiment of a process for forming the second protection layer 152 may be performed through a dry etching process using an etch gas. In such an exemplary embodiment, although the second protection layer 152 of the first area R1 is removed to expose two end portions of the oxide semiconductor pattern 140, the etch gas lacks a component capable of etching the oxide semiconductor pattern 140 so that the etch gas does not remove the oxide semiconductor pattern 140.

In one exemplary embodiment, the etch gas may also remove the partial etching layer 134 exposed by removing the second protection layer 152. A portion of the second thickness pattern TH2 of the partial etching layer 134 is removed by the etching gas so that the gate insulation layer 131 is exposed therethrough. In such an exemplary embodiment, the first thickness pattern TH1 formed below the oxide semiconductor pattern 140 may remain on the first gate insulation layer 131 using the oxide semiconductor pattern 140 as an etch stop layer. The second thickness pattern TH2 is etched in a process in which the etching gas etches the second protection layer 152 after a portion of the first protection layer 132 having the first thickness 't1' is removed to form the second thickness pattern TH2 of the partial etching layer 134, so that a patterning process may be quickly performed in comparison with a process in which the first protection layer 132 having the first thickness 't1' is etched together with the second protection layer 152.

The second protection layer 152 and the partial etching layer 134 are etched using the second photo pattern 20 as an etch stop layer, so that an etching surface of the second etching layer 152 and an etching surface ETF of the partial etching layer 134 may be disposed on a same line as described above. Thus, the etching surface ETF (refer to FIG. 3B) of the partial etching layer 134 which is disposed at a boundary between the second area R2 and the third area R3 may be disposed on the same line identical to an etching surface of the etch stopper 150, e.g., they may form a single plane together. The etching surface ETF of the partial etching layer 134 may be an etching surface of the insulation pattern 133 on which the partial etching layer 134 is patterned to be formed. For example, the etching surface ETF of the partial etching layer 134 may be an etching surface of the second thickness part 132b of the insulation pattern 133 as described above.

Side surfaces of two side walls of the second photo pattern 20 along the first direction D1 and an etching surface of the etch stopper 150 may be coplanar. Moreover, side surfaces of two side walls of the oxide semiconductor pattern 140 along the first direction D1 may be identical to an etching surface of the etch stopper 150.

The second thickness pattern TH2 and the second protection layer 150 are also removed on the gate end portion electrode 125, so that the gate insulation layer 131 on the gate end portion electrode 125 may be exposed therethrough.

Figure 7A:
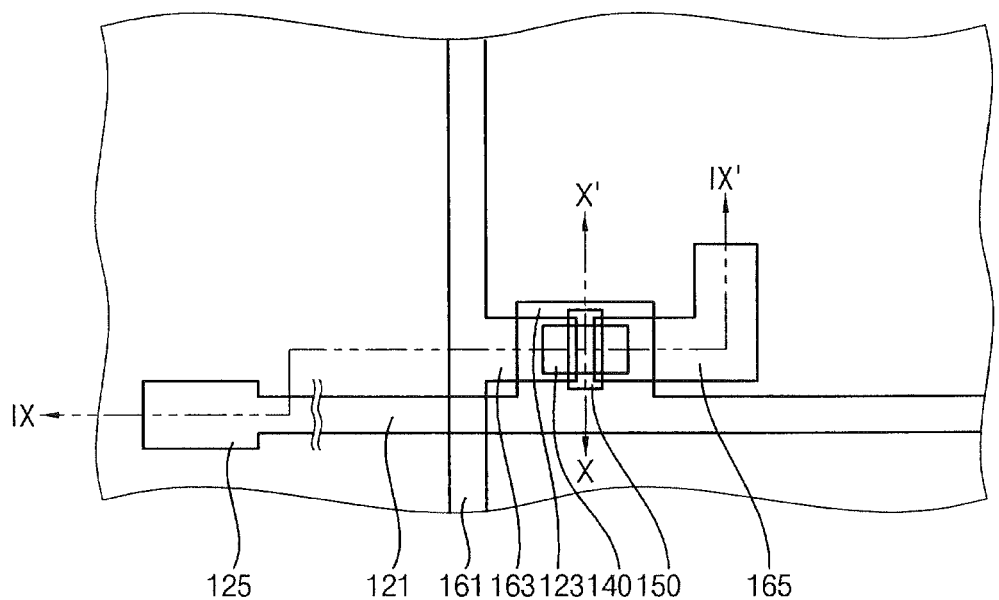
FIGS. 7A and 7B are a top plan view and a cross-sectional view, respectively, illustrating a step for forming an exemplary embodiment of a source pattern of the exemplary embodiment of a display substrate of FIG. 2.
Figure 7B:
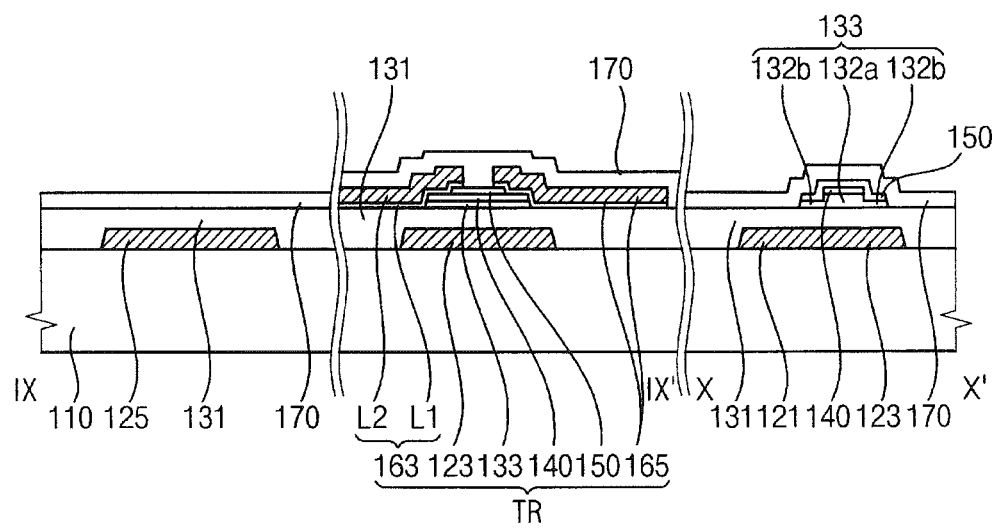

FIGS. 7A and 7B are a top plan view and a cross-sectional view, respectively, illustrating a step for forming a source pattern of an exemplary embodiment of a display substrate of FIG. 2.

For example, FIG. 7A is a top plan view illustrating a step for forming a source pattern, and FIG. 7B is a cross-sectional view taken along line IX-IX' and line X-X' of FIG. 7A.

Referring to FIGS. 7A and 7B, the source pattern is formed on the substrate 110 including the etch stopper 150.

A data metal layer including the first layer L1 and the second layer L2 is formed on the substrate 110 including the etch stopper 150, and then the data metal layer is patterned using a fourth mask (not shown) to form the source pattern. In one exemplary embodiment, the first layer L1 may include titanium, and the second layer L2 may include copper. In a process for forming the source pattern, the etch stopper 150 may prevent the oxide semiconductor pattern 140 from being damaged while the data metal layer between the source electrode 163 and the drain electrode 165 is etched.

Then, the passivation layer 170 is formed on the substrate 110 including the source pattern. The passivation layer 170 is patterned using a fifth mask (not shown) to form the contact hole CNT exposing a first end portion of the drain electrode 165. In such an exemplary embodiment, the passivation layer 170 and the gate insulation layer 131 that are formed on the gate end portion electrode 125 are removed, so that the gate end portion electrode 125 may be partially exposed.

The passivation layer 170 is patterned, and then a transparent electrode layer is formed on the substrate 110. Then, the transparent electrode layer is etched using a sixth mask (not shown) to form the pixel electrode 180 and the gate pad electrode 182.

Accordingly, the display substrate 100 as shown in FIGS. 1 and 2 may be manufactured.

According to detailed explanation above, after a protection layer having a second thickness thinner than a first thickness of an initial state in a process for forming an oxide semiconductor pattern is formed, a portion of the protection layer corresponding to the second thickness is removed in a process for forming an etch stopper. Thus, a patterning time of the protection layer may be decreased, and electrical characteristics of a switching element may be not reduced. Moreover, a reliability of the patterning process of the protection layer may be enhanced. Therefore, a productivity and manufacturing reliability of a display substrate may be enhanced.

The foregoing is illustrative of the present invention and is not to be construed as limiting thereof. Although a few exemplary embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A display substrate comprising:
    a gate pattern comprising a gate electrode disposed on a substrate;
    a gate insulation layer disposed on the substrate and the gate pattern;
    an insulation pattern comprising:
        a first thickness part disposed on a first area of the gate insulation layer overlapping the gate electrode; and
        a second thickness part disposed on a second area of the gate insulation layer adjacent to the first area,
        wherein the first thickness part has a greater thickness than the second thickness part;
    an oxide semiconductor pattern disposed on the first thickness part of the first area, wherein the insulation pattern is between the gate insulation layer and the oxide semiconductor pattern;
    an etch stopper disposed on the oxide semiconductor pattern and contacting the first and second thickness parts of the insulation pattern;
    a source pattern comprising a source electrode and a drain electrode which contact the oxide semiconductor pattern; and
    a pixel electrode which contacts the drain electrode.

2. The display substrate of claim 1, wherein
    the etch stopper comprises a first end portion and a second end portion disposed opposite to each other on the oxide semiconductor pattern so that two end portions of the oxide semiconductor pattern respectively adjacent to the first end portion of the etch stopper and the second end portion of the etch stopper are exposed by the etch stopper, and
    the source electrode and drain electrode are respectively partially overlapped with the first end portion of the etch stopper and the second end portion of the etch stopper, and directly contact the exposed two end portions of the oxide semiconductor pattern.

3. The display substrate of claim 1, wherein the etch stopper comprises:
    a first end portion and a second end portion disposed on the oxide semiconductor pattern, and
    a third end portion and a fourth end portion disposed substantially perpendicular to the first end portion and the second end portion in a top plan view, extended from the first area and disposed on the second thickness part of the insulation pattern.

4. The display substrate of claim 3, wherein the etch stopper covers side walls of the oxide semiconductor pattern at a boundary between the first area and the second area.

5. The display substrate of claim 3, further comprising a third area adjacent to the second area,
    wherein
    the second area is between the first area and the third area, and
    etch surfaces of the third end portion and the fourth end portion have a same shape as an etch surface of the insulation pattern disposed at a boundary between the third area and the second area in a top plan view.

6. The display substrate of claim 1, wherein the insulation pattern and the etch stopper comprise a same material and the gate insulation layer includes a different material than the insulation pattern.

7. The display substrate of claim 1, wherein at least one of the gate pattern and the source pattern comprises a first metal layer comprising titanium and a second metal layer comprising copper and disposed on the first metal layer.

* * * * *